(12) United States Patent
Nagashima

(10) Patent No.: US 7,947,515 B2
(45) Date of Patent: May 24, 2011

(54) DEFECT INSPECTING METHOD

(75) Inventor: Kuniharu Nagashima, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 50 days.

(21) Appl. No.: 12/614,030

(22) Filed: Nov. 6, 2009

(65) Prior Publication Data

US 2010/0323460 A1 Dec. 23, 2010

(30) Foreign Application Priority Data

Jun. 17, 2009 (JP) .................. 2009-144189

(51) Int. Cl.
*G01R 31/26* (2006.01)

(52) U.S. Cl. .................... 438/14; 257/E21.53

(58) Field of Classification Search .......... 438/10, 438/11, 14, 16; 324/762.01, 762.02, 555; 257/E21.53
See application file for complete search history.

(56) References Cited

U.S. PATENT DOCUMENTS

| 2003/0186472 A1* | 10/2003 | Watanabe | 438/14 |
| 2007/0144775 A1* | 6/2007 | Hasegawa | 174/262 |

FOREIGN PATENT DOCUMENTS

| JP | 3-149844 | 6/1991 |
| JP | 8-43061 | 2/1996 |
| JP | 8-162602 | 6/1996 |
| JP | 2005-11948 | 1/2005 |
| JP | 2006-155750 | 6/2006 |
| JP | 2007-128738 | 5/2007 |
| JP | 2007-309910 | 11/2007 |

* cited by examiner

*Primary Examiner* — Matthew Smith
*Assistant Examiner* — Christine Enad
(74) *Attorney, Agent, or Firm* — Finnegan, Henderson, Farabow, Garrett & Dunner, L.L.P.

(57) ABSTRACT

A defect inspecting method includes: forming, in a first air pressure state, a film, which covers one opening of two openings provided on an upper surface of a substrate, on a tubular contact hole formed on the substrate in manufacturing a semiconductor device and formed in a tubular shape by connecting two cylindrical contact holes on bottom surface sides thereof, both ends of the tubular shape being opened in the openings; exposing the substrate covered with the film in a second air pressure state; and observing whether the film is deformed to thereby inspect whether the part of the tubular shape is blocked.

18 Claims, 16 Drawing Sheets

DEFECT INSPECTING METHOD

CROSS-REFERENCE TO RELATED APPLICATIONS

This application is based upon and claims the benefit of priority from the prior Japanese Patent Application No. 2009-144189, filed on Jun. 17, 2009; the entire contents of which are incorporated herein by reference.

BACKGROUND OF THE INVENTION

1. Field of the Invention

The present invention relates to a defect inspecting method for a semiconductor device.

2. Description of the Related Art

A semiconductor device is manufactured by, for example, laminating films, forming contact holes, and embedding a wiring material in contact holes. When the contact holes are formed, the wiring material cannot be embedded in the entire contact holes unless the contact holes are conductive. Therefore, a conduction inspection for the contact holes is performed when the semiconductor device is manufactured.

As a method of checking conduction after the contact holes are formed, for example, there are a voltage contrast (VC) inspection performed by using a secondary electron image and an inspection performed by using a substrate current measuring device. In both the conduction checking methods, conductive films at hole bottoms need to be earthed (needs to be conductive to a silicon wafer substrate). However, in an actual semiconductor product, the conductive films at the hole bottoms are not always earthed. This is because, in some case, insulating films are formed in layers below the conductive films at the hole bottoms.

As one of semiconductor devices in which contact holes having a large aspect ratio (a ratio of depth to a hole diameter) have to be formed, there is a semiconductor memory device in which memory cell arrays in a plurality of layers are laminated (see, for example, Japanese Patent Application Laid-Open No. 2006-155750).

However, in this semiconductor memory device, even when the conductive films at the hole bottoms are conductive to the silicon wafer substrate, most of secondary electrons collide against the sidewalls of the holes because the aspect ratio is large (the depth of the contact holes is large). Therefore, a conduction state of the contact holes cannot be inspected. In the case of an optical defect inspection, when the aspect ratio is large, a conduction state of the contact holes cannot be inspected because light does not reach the hole bottoms.

For example, in the case of a defect inspection and an optical defect inspection performed by using secondary electrons, contact holes having an aspect ratio equal to or larger than about 5 (depth equal to or larger than about 200 nanometers) cannot be inspected.

BRIEF SUMMARY OF THE INVENTION

A defect inspecting method according to an embodiment of the present invention comprises: forming, in a first air pressure state, a film, which covers one opening of two openings provided on an upper surface of a substrate, on a tubular contact hole formed on the substrate in manufacturing a semiconductor device and formed in a tubular shape by connecting two cylindrical contact holes on bottom surface sides thereof, both ends of the tubular shape being opened in the openings; deforming the film on the tubular contact hole, a part of the tubular shape of which is blocked in the tubular contact hole, by exposing the substrate covered with the film in a second air pressure state different from the first air pressure state; and observing whether the film is deformed to thereby inspect whether the part of the tubular shape of the tubular contact hole is blocked.

BRIEF DESCRIPTION OF THE DRAWINGS

FIGS. 8A and 8B to FIGS. 15A and 15B are schematic sectional views of an example of a procedure for manufacturing a nonvolatile semiconductor memory device having U-tubes.

DETAILED DESCRIPTION OF THE INVENTION

Exemplary embodiments of the present invention are explained in detail below with reference to the accompanying drawings. The present invention is not limited by the embodiments.

Figure 1:
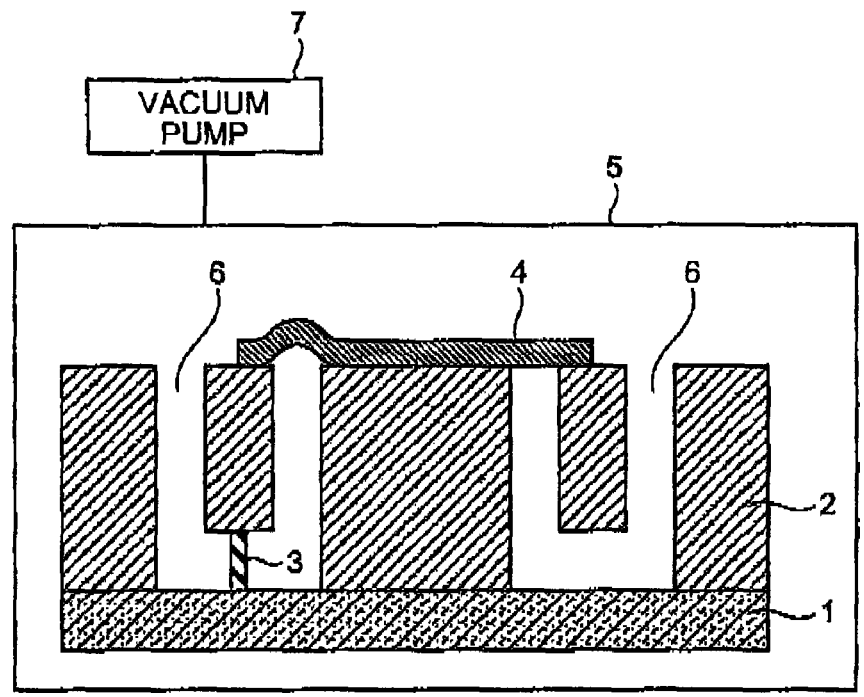
FIG. 1 is a diagram for explaining a concept of a defect inspecting method according to an embodiment of the present invention.

FIG. 1 is a diagram for explaining a concept of a defect inspecting method according to an embodiment of the present invention. As an example of a semiconductor device in which a conduction inspection (a defect inspection) of contact holes is difficult, there is Bit-Cost Scalable (BiCS) that stores, in a nonvolatile manner, resistance information (e.g., a high resistance state and a low resistance state) of an electrically-rewritable resistance changing element. In such BiCS, a contact hole having U-shaped sectional shape is formed. The U-shaped contact hole is formed by, after forming, for example, two contact holes from a top surface side to a bottom surface side, drilling a hole to connect hole bottoms of the two contact holes.

In this embodiment, a conduction inspection for such a U-shaped contact hole is performed. In FIG. 1, a sectional view of a substrate carried into a vacuum chamber 5 is shown. A wiring layer 2 is formed on a silicon wafer 1 that is a substrate for forming a semiconductor device. Tubular contact holes having a U-shape (hereinafter, "U-tubes 6") are formed in the wiring layer 2. The U-tubes 6 are contact holes having a U-shape in section. Ends of the tubes are opened in a top surface of the wiring layer 2.

Sections where hole bottoms of two contact holes are connected (hereinafter, "hole bottoms") are formed by, for example, wet etching. In some case, the hole bottoms do not become conductive because of an etching failure. The U-tubes 6 are sections in which a wiring material is embedded. Unless the hole bottoms are not conductive, a wire is in a disconnected state in the hole bottom sections even if the wiring material is embedded. Therefore, in this embodiment, a defect inspection is performed to check whether the hole bottoms of the U-tubes 6 are conductive.

In FIG. 1, dregs 3 are left at the hole bottom on the left U-tube 6 and the hole bottom of the right U-tube 6 is normal. In other words, the left U-tube 6 is not conductive from one opening to the other opening and the right U-tube 6 is conductive from one opening to the other opening.

After the U-tubes 6 are formed, one opening of the two openings of each of the U-tubes 6 is plugged with a plastic material (a plastic film 4). The plastic film 4 is a film that, when once deformed, keeps a deformed state after that and does not return to an original state thereof. The silicon wafer 1 with one openings of the U-tubes 6 closed by the plastic film 4 is carried into the vacuum chamber 5. The inside of the vacuum chamber 5 is drawn a vacuum by a vacuum pump 7. In other words, the silicon wafer 1 is drawn a vacuum in a state in which the other openings are open. Consequently, the silicon wafer 1 is exposed under a negative pressure environment (pressure equal to or lower than the atmospheric pressure).

When the dregs 3 in the wet etching adhere to the hole bottom, the plastic film 4 is deformed by a difference between the pressure on the inside of the U-tube 6 and the pressure on the outside of the U-tube 6 (a pressure difference between the top surface side and the bottom surface side of the plastic film 4).

Figure 2A:
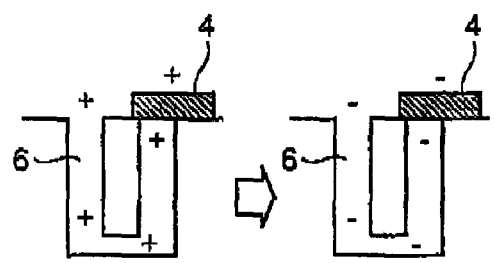
FIGS. 2A and 2B are diagrams for explaining deformation of a plastic film due to a pressure difference.
Figure 2B:
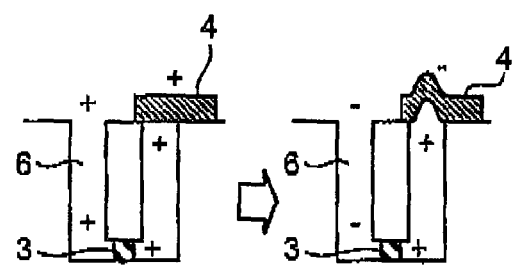

FIGS. 2A and 2B are diagrams for explaining the deformation of the plastic film due to the pressure difference. In FIG. 2A, a change in the plastic film 4 that occurs when the normal U-tube 6 is drawn a vacuum is shown. In FIG. 2B, a change in the plastic film 4 that occurs when the U-tube 6 having a defect (the dregs 3) is drawn a vacuum is shown.

As shown on the left side of FIG. 2A and the left side of FIG. 2B, in a state in which the plastic film 4 is formed, both the normal U-tube 6 and the U-tube 6 having the dregs 3 have the atmospheric pressure on the inside and on the outside thereof. In FIGS. 2A and 2B, regions under the atmospheric pressure is indicated by "+". Thereafter, as shown on the right side of FIG. 2A and the right side of FIG. 2B, the normal U-tube 6 and the U-tube 6 having the dregs 3 are drawn a vacuum. In FIGS. 2A and 2B, vacuum regions are indicated by "−". As shown in FIG. 2A, when the normal U-tube 6 is drawn a vacuum, both the inside and the outside of the U-tube 6 are in a vacuum. Therefore, no pressure difference occurs between the inside of the U-tube 6 and the outside of the U-tube 6. As a result, the plastic film 4 keeps an original form thereof without being deformed.

On the other hand, as shown in FIG. 2B, when the U-tube 6 having the dregs 3 is drawn a vacuum, a region between the dregs 3 and the opening of the U-tube 6 (the opening on the side not covered with the plastic film 4) is in a vacuum. The outside of the U-tube 6 is also in a vacuum. However, a region between the dregs 3 and the plastic film 4 in the U-tube 6 is left under the atmospheric pressure. Therefore, a pressure difference occurs between the inside of the U-tube 6 and the outside of the U-tube 6. As a result, the plastic film 4 is deformed. Specifically, the plastic film 4 swells to the outer side of the U-tube 6, i.e., the vacuum side. Because the plastic film 4 has plasticity, the U-tube 6 having the dregs 3 is kept deformed even if the U-tube 6 is returned to under the atmospheric pressure.

The silicon wafer 1 in which the plastic film 4 is formed in one openings of the U-tubes 6 are returned to under the atmospheric pressure after being drawn a vacuum. As a defect inspection for the U-tubes 6, the plastic film 4 after being drawn a vacuum is observed by an optical microscope or the like. The U-tube 6 in which the plastic film 4 swells to the top surface side is determined as the U-tube 6 having a defect. The U-tube 6 in which the plastic film 4 is not deformed is determined as the normal U-tube 6.

Figure 3A:
FIGS. 3A to 3I are schematic sectional views of an example of a procedure of a method of manufacturing a U-tube.
Figure 3B:
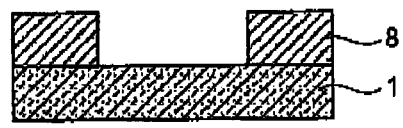
Figure 3C:
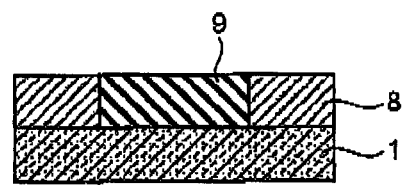

FIGS. 3A to 3I are schematic sectional views of an example of a procedure of a method of manufacturing a U-tube. First, an insulating film such as a silicon oxide film 8 as a base is formed on a semiconductor substrate such as the silicon wafer 1 (FIG. 3A). Thereafter, a section to be formed as a hole bottom (a return bottom) of the silicon oxide film 8 is etched by the reactive ion etching (RIE) or the like (FIG. 3B). An embedding material 9 is embedded in the section to be formed as the hole bottom (FIG. 3C). The embedding material 9 is a film for forming a wiring pattern in an upper layer and is a film (e.g., a nitride film) to be dissolved by a chemical later.

Figure 3D:
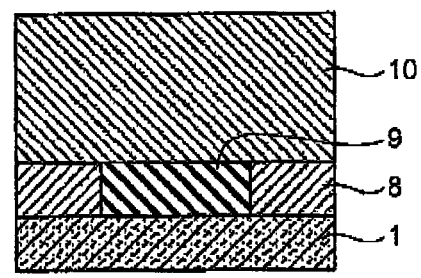
Figure 3E:
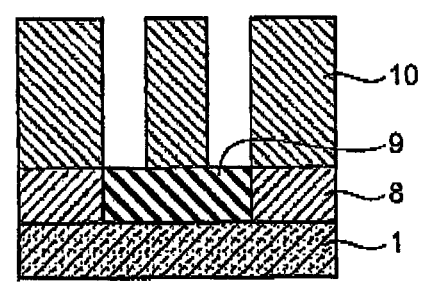
Figure 3F:
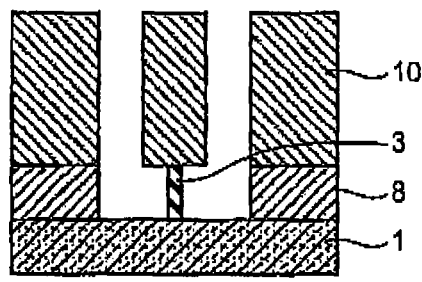

Thereafter, a wiring material film (a wiring layer 10) of silicon, metal, or the like to be formed as a wiring pattern is formed on the upper surfaces of the silicon oxide film 8 and the embedding material 9 (FIG. 3D). After the wiring layer 10 is formed, contact holes for forming the U-tube 6 are formed in the wiring layer 10 by the RIE or the like. Two contact holes are formed for one U-tube 6 (FIG. 3E). Wet etching for the embedding material 9 is performed in the formed contact holes to remove the embedding material 9 from hole bottoms. When the embedding material 9 is removed from the hole bottoms, in some case, the dregs 3 remain at the hole bottoms because of a wet etching failure (FIG. 3F).

Figure 3G:
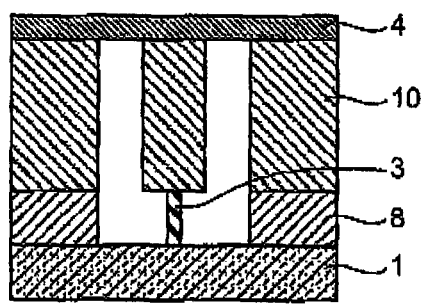
Figure 3H:
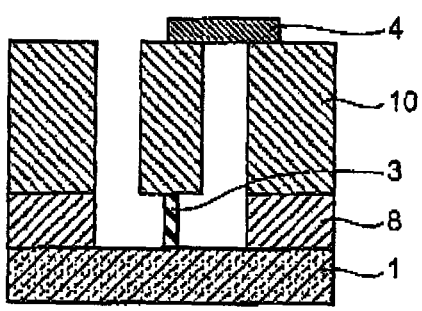

After the embedding material 9 is removed from the hole bottoms, for example, polymer resin, a polymer film, or the like is formed on the wiring layer 10 as the plastic film 4 by about 200 nanometers in thickness (FIG. 3G). The plastic film 4 is formed on the wiring layer 10 not to enter opening holes of the U-tube 6. The plastic film 4 can be formed on the wiring layer 10 such that a part of the plastic film 4 enters the open holes of the U-tube 6. Thereafter, the plastic film 4 is patterned such that only one opening of openings of the U-tube 6 (only one side of the return tube) is plugged (FIG. 3H). The silicon wafer 1 in which only one opening of the U-tube 6 is covered with the plastic film 4 is carried into the vacuum chamber 5. The inside of the vacuum chamber 5 (the entire system) is drawn a vacuum by the vacuum pump 7.

Figure 3I:
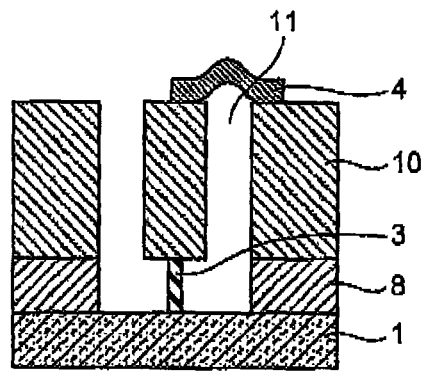

A region (a defect space 11) between the dregs 3 and the plastic film 4 in the U-tube 6 is under the atmospheric pressure (1013 hPa). On the other hand, an external pressure (in the inside of the vacuum chamber 5 excluding the defect space 11) is a negative pressure (e.g., 1 e to 1 Pa). Therefore, a pressure difference occurs between the defect space 11 and regions other than the defect space 11 (between the top surface side and the bottom surface side of the plastic film 4). The plastic film 4 is deformed as shown in FIG. 3I. In this embodiment, the deformation of the plastic film 4 is detected by a defect inspection.

The plastic film 4 can be formed on one opening by any method. For example, the plastic film 4 can be bonded to the entire surface of the openings of the U-tube 6 as a film or predetermined liquid (film) such as a resist can be applied to the entire surface of the silicon wafer 1. In these cases, the plastic film 4 is patterned only in one opening of the U-tube 6 by exposing only a predetermined section of the bonded film or the applied resist or the like to light.

The plastic film 4 can be applied through a nozzle by a dispensing device or the like or can be printed by a screen printing device or the like. When the plastic film 4 is applied by the dispensing device, the plastic film 4 is applied only on one opening of the U-tube 6 by the dispensing device. When the plastic film 4 is printed by the screen printing device, the plastic film 4 is printed only on one opening of the U-tube 6 by the screen printing device.

A film that covers the openings of the U-tube 6 is not limited to the plastic film 4 and can be other films. The film that covers the openings of the U-tube 6 (an opening film) only has to be a material that is deformed when there is a predetermined pressure difference between the inside and the outside of the U-tube 6.

Figure 4:
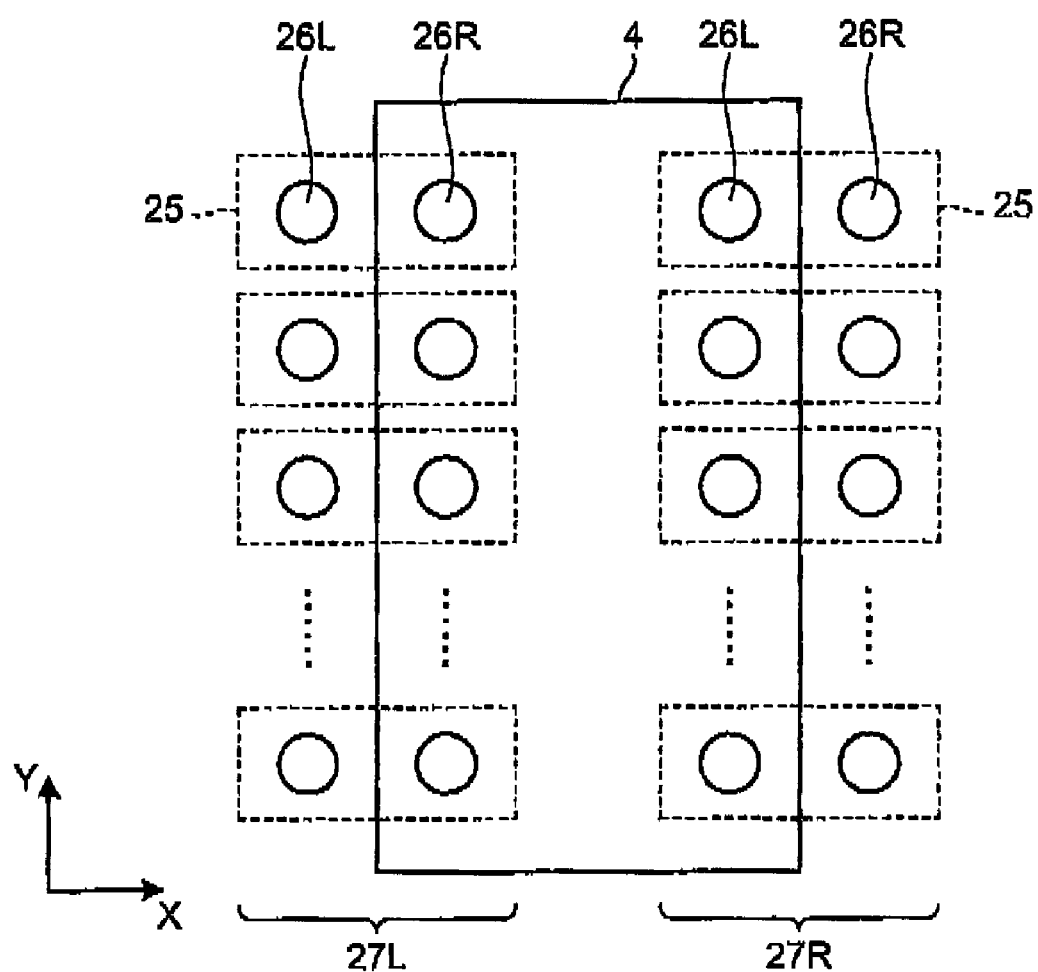
FIG. 4 is a diagram of an example of a patterning shape of the plastic film.

FIG. 4 is a diagram of an example of a patterning shape of the plastic film 4. A top view of the plastic film 4 is shown in FIG. 4. In this figure, a left to right direction on the paper surface is set as an X direction and an up to down direction on the paper surface is set as a Y direction.

On the silicon wafer 1, U-shaped regions 25 in which U-tubes 6 are formed are arranged in a matrix shape in the X direction and the Y direction at predetermined intervals. Specifically, the U-shaped regions 25 are formed such that a line connecting a left opening 26L and a right opening 26R of the U-tube 6 (a direction in which the hole bottoms extend) is parallel to the X direction. On the silicon wafer 1, a plurality of the U-shaped regions 25 are arranged in the Y direction as a set of region group 27L and region group 27R.

In the region groups 27L and 27R, the openings 26L and 26R of the U-tubes 6 respectively line up in the Y direction. In the region groups 27L and 27R adjacent to each other, the openings 26L of the left U-tubes 6, the openings 26R of the left U-tubes 6, the openings 26L of the right U-tubes 6, and the openings 26R of the right U-tubes 6 line up in the X direction in this order.

In this embodiment, when the U-shaped regions are arranged in a matrix shape at predetermined intervals in the X direction and the Y direction, the plastic film 4 is patterned such that the openings 26R of the left U-tubes 6 and the openings 26L of the right U-tubes 6 are covered with a pattern of one plastic film 4.

In one set of region groups 27L and 27R, the opening 26L and 26R of the U-tubes 6 respectively line up in the Y direction. Therefore, the plastic film 4 is patterned such that all the openings 26L or all the openings 26R lining up in the Y direction in the set of region groups 27L and 27R can be covered with the plastic film 4.

Consequently, the plastic film 4 is patterned such that all the openings 26R formed in the left region group 27L and all the openings 26L formed in the right region group 27R in the region groups 27L and 27R adjacent to each other are covered by one plastic film 4. Therefore, because an area covered by the plastic film 4 is large, patterning of the plastic film 4 is easily performed and observation of the plastic film 4 in the defect inspection is easily performed.

As explained above, in this embodiment, in the defect inspection for a tubular contact hole pattern, both ends of which are opened on a substrate, an opening on one side of the tubular contact hole pattern is plugged by the plastic film 4. When the entire system of the vacuum chamber 5, in which the silicon wafer 1 to be formed as a semiconductor device is carried, is decompressed, the plastic film 4 is deformed by an air pressure difference caused in a machining failure section and the deformed plastic film 4 (a plug material) is detected as a defect. Consequently, a machining failure defect in the tube is detected.

After the defect inspection for the U-tube 6 is completed, the plastic film 4 is peeled from the silicon wafer 1. When it is determined by the defect inspection that there is a defect in the U-tube 6, the embedding material 9 is etched by wet etching or the like again in the silicon wafer 1 determined as having the defect. Thereafter, the plastic film 4 is formed in one opening of the U-tube 6 and drawn a vacuum in the vacuum chamber 5 again. The defect inspection for the U-tube 6 is performed based on whether the plastic film 4 is deformed.

The wet etching of the embedding material 9, the formation of the plastic film 4, the vacuum processing, the observation for determining deformation of the plastic film 4, and the like are repeatedly performed in the silicon wafer 1 until it is determined that there is no defect in the U-tube 6.

When it is determined by the defect inspection that there is no defect in the U-tube 6, the next processing is applied to the silicon wafer 1. Consequently, a semiconductor device or the like including the silicon wafer 1 determined as not having the dregs 3 is manufactured.

Figure 5:
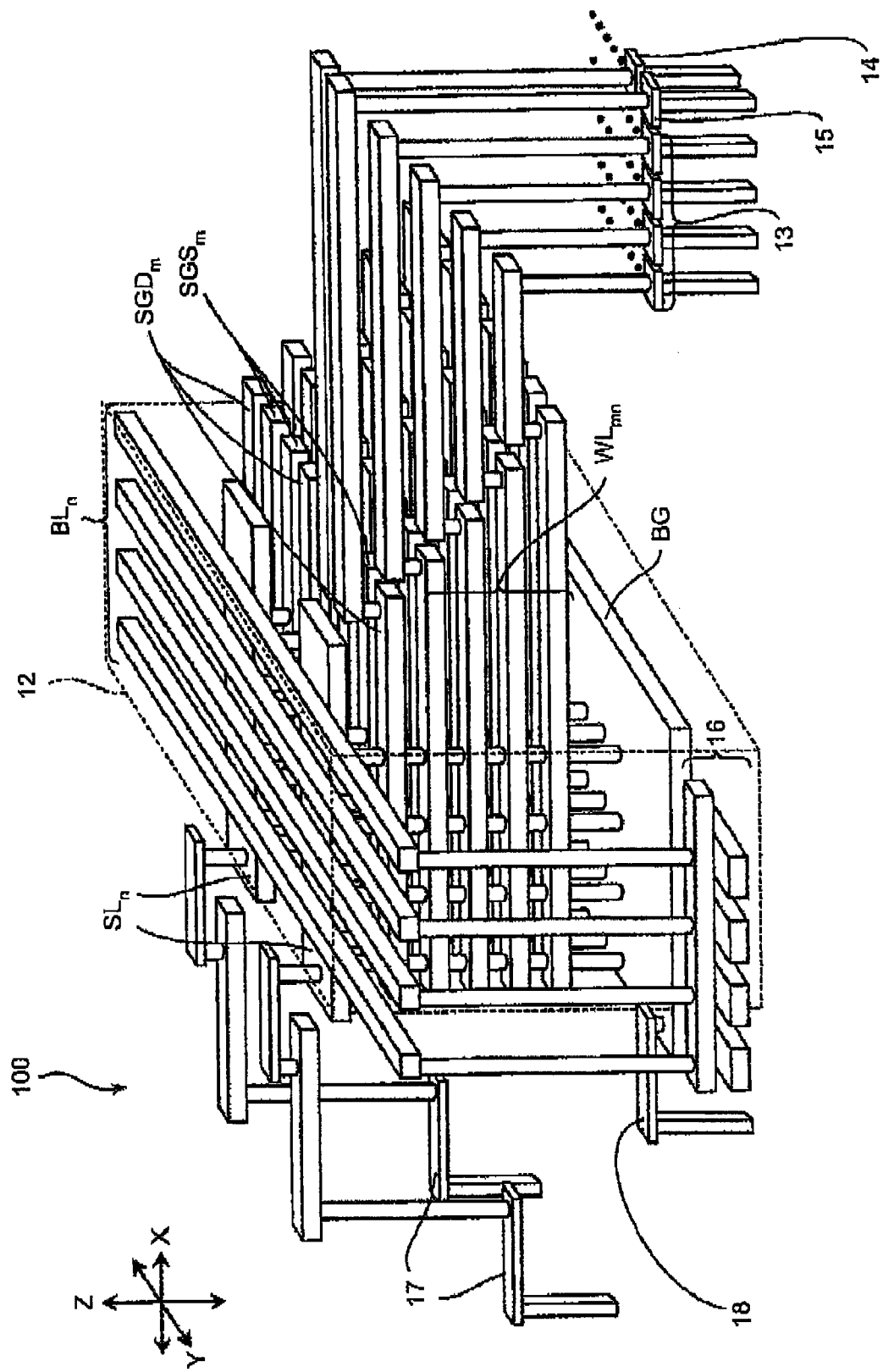
FIG. 5 is a diagram of the schematic configuration of a nonvolatile semiconductor memory device.

FIG. 5 is a diagram of the schematic configuration of a nonvolatile semiconductor memory device. In FIG. 5, a perspective view of a nonvolatile semiconductor memory device 100 is shown with a row direction represented as row direction X, a column direction represented as column direction Y, and a laminating direction represented as a laminating direction Z.

As shown in FIG. 5, the nonvolatile semiconductor memory device 100 includes a memory transistor region 12, a word-line driving circuit 13, a source-side-selection-gate-line ($SGS_m$) driving circuit 14, a drain-side-selection-gate-line ($SGD_m$) driving circuit 15, a sense amplifier 16, a source-line driving circuit 17, and a back-gate-transistor driving circuit 18.

The memory transistor region 12 has a memory transistor that stores data. The word-line driving circuit 13 controls voltage applied to word lines $WL_{mn}$. The source-side-selection-gate-line ($SGS_m$) driving circuit 14 controls voltage applied to source-side-selection gate lines $SGS_m$. The drain-side-selection-gate-line ($SGD_m$) driving circuit 15 controls voltage applied to drain-side-selection gate lines $SGD_m$. The sense amplifier 16 amplifies potential read out from the memory transistor. The source-line driving circuit 17 controls voltage applied to source lines $SL_n$. The back-gate-transistor driving circuit 18 controls voltage applied to a back gate line BG. Besides the circuits explained above, the nonvolatile semiconductor memory device 100 includes a bit-line driving circuit (not shown in the figure) that controls voltage applied to bit lines $BL_n$.

Figure 6:
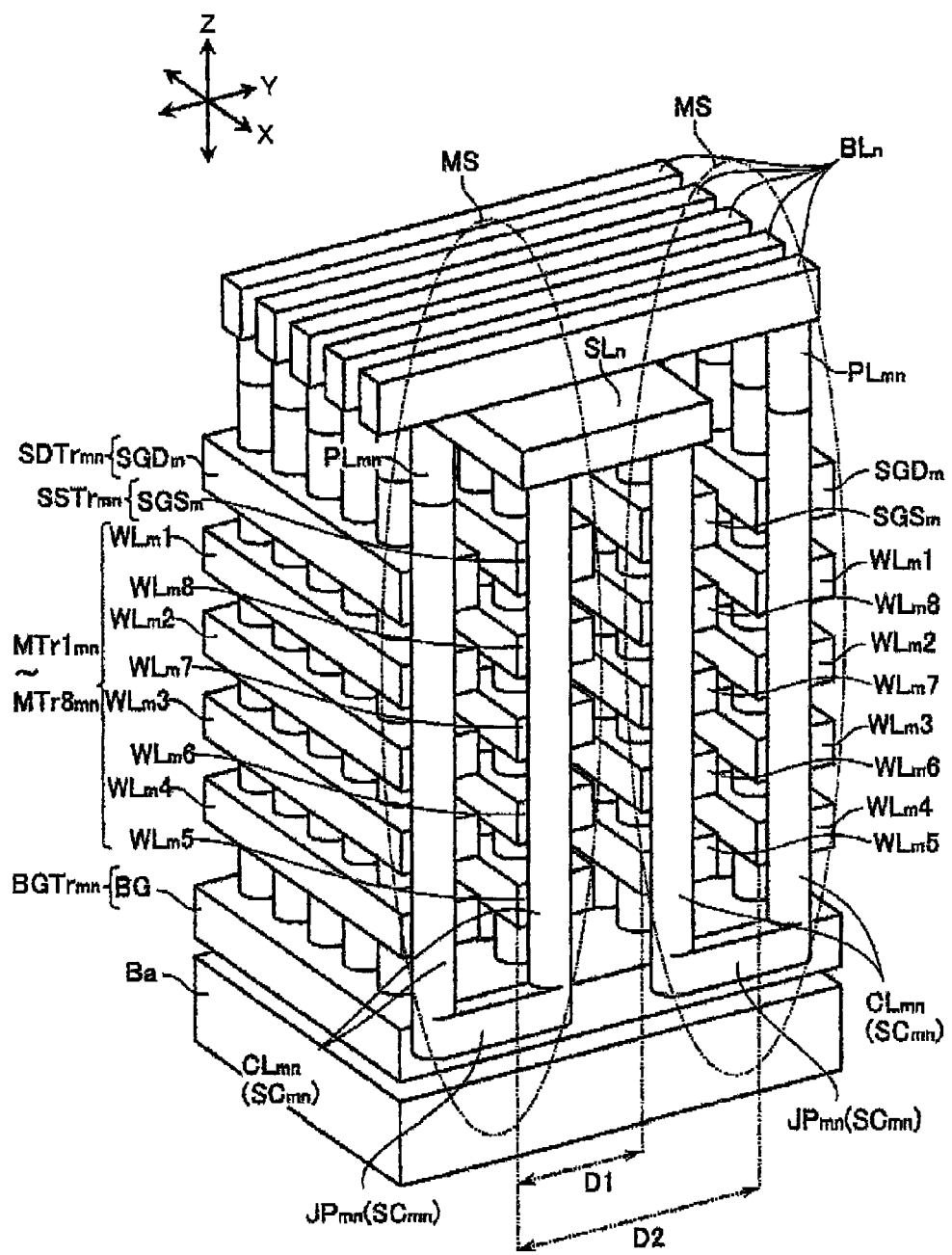
FIG. 6 is a schematic perspective view of a part of a memory transistor region of the nonvolatile semiconductor memory device.

FIG. 6 is a schematic perspective view of a part of the memory transistor region of the nonvolatile semiconductor memory device. In FIG. 6, a perspective view of the memory transistor region 12 is shown with a row direction represented as row direction X, a column direction represented as column direction Y, and a laminating direction represented as laminating direction Z. In this embodiment, the memory transistor region 12 includes m×n (m and n are natural numbers) memory strings MS including memory transistors ($MTr1_{mn}$ to $MTr8_{mn}$), source-side selection transistors $SSTr_{mn}$, and drain-side-selection transistors $SDTr_{mn}$. In FIG. 6, as an example, m is 6 and n is 2.

Figure 7:
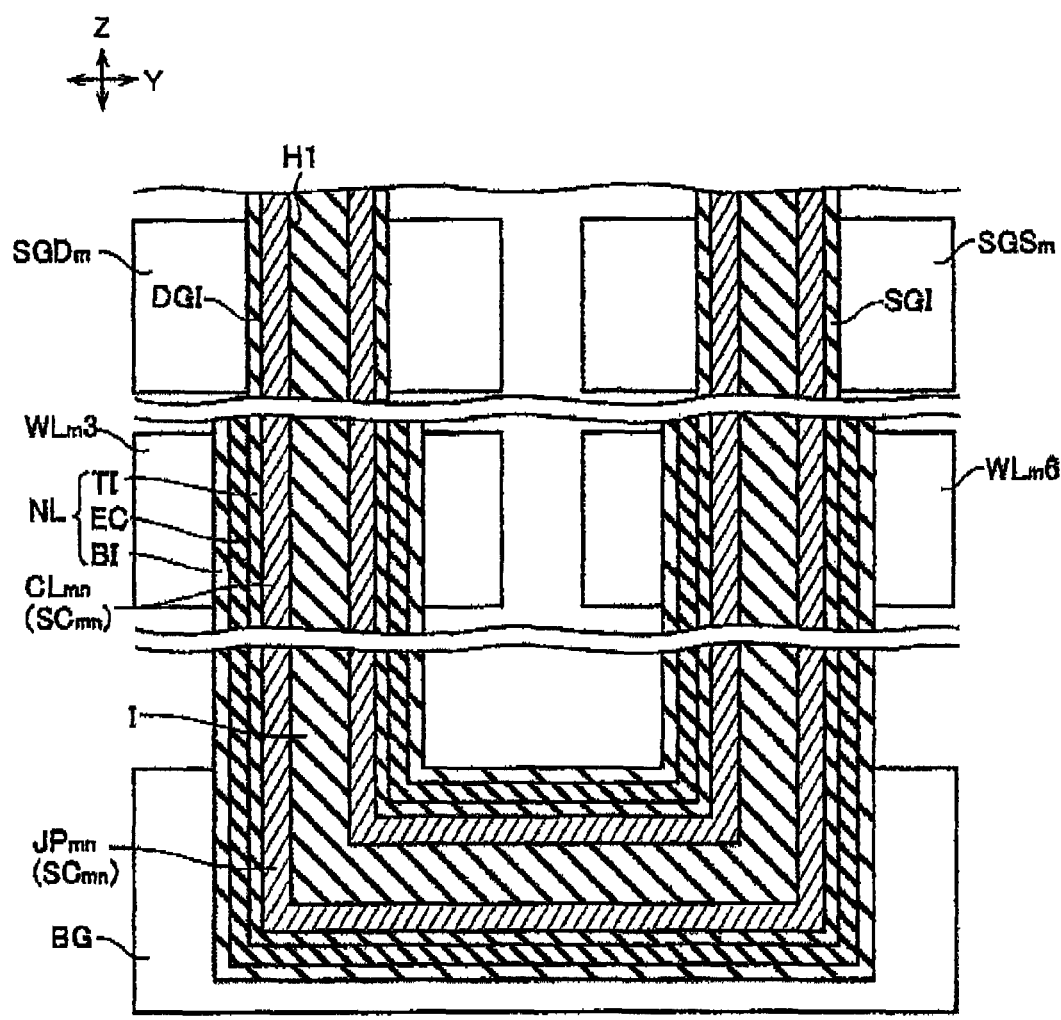
FIG. 7 is a partial enlarged sectional view of FIG. 6.

FIG. 7 is a partial enlarged sectional view of FIG. 6. In FIG. 7, the sectional configuration of the memory transistor region 12 viewed from the row direction X is shown. In the nonvolatile semiconductor memory device 100, a plurality of memory strings MS are provided in the memory transistor region 12. Each of the memory strings MS has a configuration in which a plurality of electrically rewritable memory transistors $MTr_{mn}$ are connected in series. As shown in FIGS. 5 and 6, the memory transistors $MTr_{mn}$ included in the memory string MS are formed by laminating a plurality of semiconductor layers.

The memory string MS includes U-shaped semiconductors $SC_{mn}$, word lines $WL_{mn}$ ($WL_m1$ to $WL_m8$), source-side-selection gate lines $SGS_m$, and drain-side-selection gate lines $SGD_m$. The memory string MS also includes a back gate line BG.

The U-shaped semiconductors $SC_{mn}$ are formed in a U shape viewed from the row direction X. Each of the U-shaped semiconductors $SC_{mn}$ includes a pair of columnar sections $CL_{mn}$ extending in a substantially vertical direction with respect to a semiconductor substrate Ba and a connecting section $JP_{mn}$ formed to connect lower ends of the pair of columnar sections $CL_{mn}$. As shown in FIG. 7, the U-shaped semiconductor $SC_{mn}$ includes a hollow H1 that communicates from the upper end of one columnar section $CL_{mn}$ to the upper end of the other columnar section $CL_{mn}$ via the connecting section $JP_{mn}$. An insulating section I is formed in the hollow H1. The columnar sections $CL_{mn}$ can be formed in a cylindrical shape or can be formed in a prism shape. The columnar section $CL_{mn}$ can be formed in a columnar shape having a step shape. The row direction X is a direction orthogonal to the laminating direction A. The column direction Y explained later is a direction orthogonal to the vertical direction and the row direction X.

The U-shaped semiconductor $SC_{mn}$ is arranged such that a straight line connecting center axes of the pair of columnar sections $CL_{mn}$ is parallel to the column direction Y. The U-shaped semiconductors $SC_{mn}$ are arranged in a matrix shape in a plane formed by the row direction X and the column direction Y.

The word lines $WL_{mn}$ in respective layers have a shape extending in parallel to the row direction X. The word lines $WL_{mn}$ in the respective layers are repeatedly formed in a line shape to be insulated and separated from one another a first space apart in the column direction Y.

The gates of the memory transistors ($MTr1_{mn}$ to $MTr8_{mn}$) provided in the same position in the column direction Y and lining up in the row direction X are connected to the same word line $WL_{mn}$. The word lines $WL_{mn}$ are arranged substantially perpendicularly to the memory strings MS. Ends in the row direction X and ends in the column direction Y of the word lines $WL_{mn}$ are formed in a step shape. The ends in the column direction Y of the word lines $WL_{mn}$ are not limited to the step shape. For example, the ends in the column direction Y of the word lines $WL_{mn}$ can be formed to be aligned in a predetermined position in the column direction Y.

As shown in FIG. 7, an oxide-nitride-oxide (ONO) layer NL is formed between the word line $WL_{mn}$ and the columnar section $CL_{mn}$. The ONO layer NL includes a tunnel insulating layer TI set in contact with the columnar section $CL_{mn}$, a charge accumulating layer EC set in contact with the tunnel insulating layer TI, and a block insulating layer BI set in contact with the charge accumulating layer EC. The charge accumulating layer EC has a function of accumulating charges.

In other words, the charge accumulating layer EC is formed to surround the side of the columnar section $CL_{mn}$. The word lines $WL_{mn}$ are formed to surround the side of the columnar section $CL_{mn}$ and the charge accumulating layer EC. The word lines $WL_{mn}$ are divided for each of the columnar sections $CL_{mn}$ adjacent to one another in the column direction Y.

The drain-side-selection gate line $SGD_m$ is provided above the word line $WL_{mn}$ at the top. The drain-side-selection gate line $SGD_m$ has a shape extending in parallel to the row direction X. The drain-side-selection gate lines $SGD_m$ are repeatedly formed in a line shape to be insulated and separated from one another a first space D1 or a second space D2 (D2>D1) apart in the column direction Y. The drain-side-selection gate lines $SGD_m$ are formed at the second space D2 across the source-side-selection gate line $SGS_m$ explained later. The columnar section $CL_{mn}$ is formed piercing through the center in the column direction Y of the drain-side-selection gate line $SGD_m$. As shown in FIG. 7, a gate insulating film DGI is formed between the drain-side-selection gate line $SGD_m$ and the columnar section $CL_{mn}$.

The source-side-selection gate line $SGS_m$ is provided above the word line $WL_{mn}$ at the top. The source-side-selection gate line $SGS_m$ has a shape extending in parallel to the row direction X. The sour-side-selection gate lines $SGS_m$ are repeatedly formed in a line shape to be insulated and separated from one another the first space D1 or the second space D2 apart in the column direction Y. The source-side-selection gate lines $SGS_m$ are formed at the second space D2 across the drain-side-selection gate line $SGD_m$. The columnar section $CL_{mn}$ is formed piercing through the center in the column direction Y of the source-side-selection gate line $SGS_m$. As shown in FIG. 7, a gate insulating layer SGI is formed between the source-side-selection gate line $SGS_m$ and the columnar section $CL_{mn}$.

In other words, the two drain-side-selection gate lines $SGD_m$ and the two source-side-selection gate lines $SGS_m$ are alternately formed the first space D1 apart from each other in the column direction Y. The drain-side-selection gate lines $SGD_m$ and the source-side-selection gate lines $SGS_m$ are formed to surround the columnar section $CL_{mn}$ and the gate insulating layers SGI and DGI. The drain-side-selection gate lines $SGD_m$ and the source-side-selection gate lines $SGS_m$ are divided for each of the columnar sections $CL_{mn}$ adjacent to one another in the column direction Y.

The back gate line BG is formed to two-dimensionally spread in the row direction X and the column direction Y to cover a lower part of a plurality of connecting sections $JP_{mn}$. As shown in FIG. 7, the ONO layer NL is formed between the back gate line BG and the connecting section $JP_{mn}$. The source line $SL_n$ is formed at the upper ends of the U-shaped semiconductors $SC_{mn}$ and the columnar sections $CL_{mn}$ adjacent to each other in the column direction Y.

The bit lines $BL_n$ are formed via the plug lines $PL_{mn}$ at the upper ends of the columnar sections $CL_{mn}$ extending to above the drain-side-selection gate lines $SGD_m$. The bit lines $BL_n$ are formed to be located above the source line $SL_n$. The bit lines $BL_n$ are repeatedly formed in a line shape extending in the column direction Y a predetermined space apart in the row direction X. In this embodiment, when the nonvolatile semiconductor memory device 100 is manufactured, a conduction inspection for the hollow H1 and the like as the U-tube forming the U-tube insulating section I forming the U-shaped semiconductor $SC_{mn}$ is performed.

A method of manufacturing the nonvolatile semiconductor memory device 100 having the U-tubes is explained with reference to FIGS. 8A and 8B to FIGS. 15A and 15B. In the following explanation, a method of manufacturing the memory transistor region 12 is explained. Explanation of a method of manufacturing the terminal end and the peripheral region of the memory transistor region 12 is omitted.

FIGS. 8A and 8B to FIGS. 15A and 15B are schematic sectional views of an example of a manufacturing procedure for the nonvolatile semiconductor memory device having the U-tubes. In FIGS. 8A and 8B to FIGS. 15A and 15B, sectional views of the memory transistor region 12 are shown. In FIGS. 8A and 8B to FIGS. 15A and 15B, FIGS. 8A, 9A, 10A, 11A, 12A, 13A, 14A, and 15A are sectional views viewed from the row direction X and FIGS. 8B, 9B, 10B, 11B, 12B, 13B, 14B, and 15B are sectional views viewed from the column direction Y.

Figure 8A:
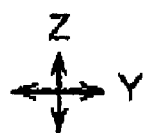
Figure 8A:
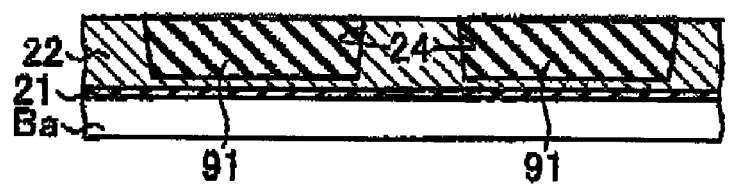
Figure 8B:
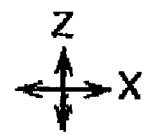
Figure 8B:
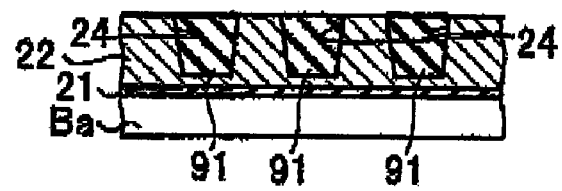

First, as shown in FIGS. 8A and 8B, the semiconductor substrate Ba is prepared. After silicon oxide ($SiO_2$) and polysilicon (p-Si) are deposited on the semiconductor substrate Ba, a back-gate insulating layer 21 and a back-gate conductive layer 22 are formed in the memory transistor region 12 by using the lithography, the RIE, or the ion implantation. Subsequently, the back-gate conductive layer 22 is drilled to form back gate holes 24. The back gate holes 24 are formed to have island-shaped openings latitudinal in the row direction X and longitudinal in the column direction Y. The back gate holes 24 are formed at predetermined intervals in the row direction X and the column direction Y.

Silicon nitride (SiN) is deposited to fill the inside of the back gate holes 24. The silicon nitride (SiN) in an upper part of the back-gate conductive layer 22 is removed by the chemical mechanical polishing (CMP) or the RIE to form first sacrificial layers 91 in the back gate holes 24. As shown in FIGS. 8A and 8B, the back gate holes 24 are formed to depth where the back gate holes 24 do not pierce through the back-gate conductive layer 22. However, the back gate holes 24 can be formed to pierce through the back-gate conductive layer 22.

Figure 9A:
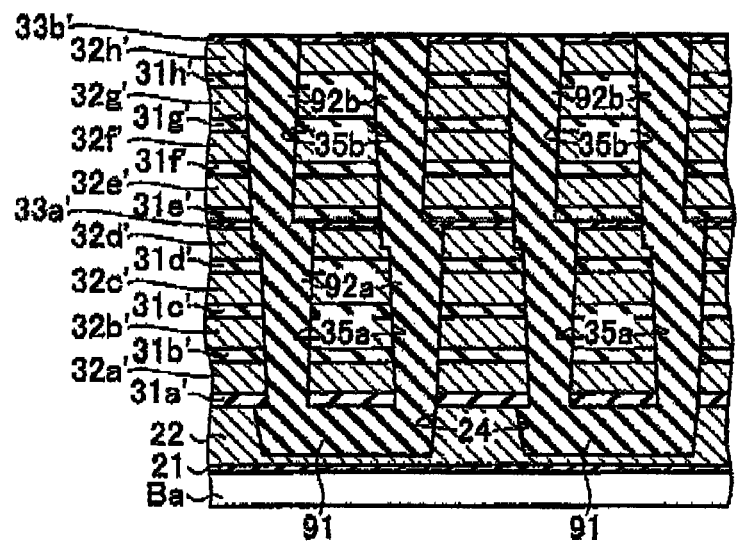
Figure 9B:
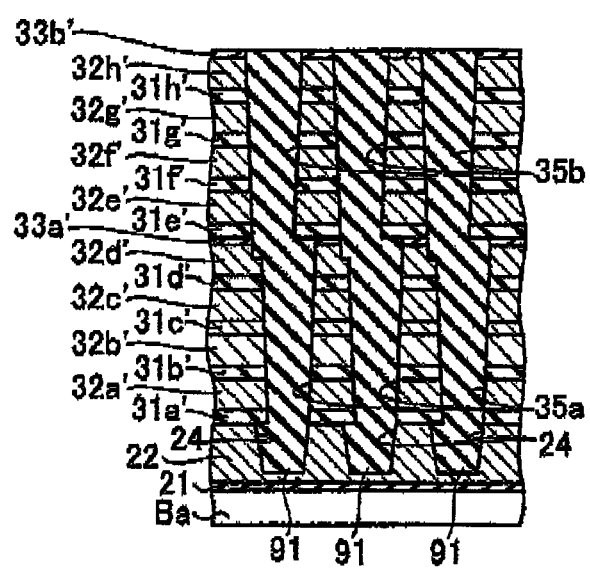

As shown in FIGS. 9A and 9B, silicon oxide ($SiO_2$) and polysilicon (p-Si) are alternately laminated on the back-gate conductive layer 22 and the sacrificial layers 91 to form first to fourth tabular inter-word-line insulating layers $31a'$ to $31d'$, first to fourth tabular polysilicon conductive layers $32a'$ to $32d'$, and a first tabular separation insulating layer $33a'$. The first to fourth tabular inter-word-line insulating layers $31a'$ to $31d'$, the first to fourth tabular polysilicon conductive layers $32a'$ to $32d'$, and the first tabular separation insulating layer $33a'$ are formed to two-dimensionally spread in directions (the row direction X and the column direction Y) orthogonal to the laminating direction Z.

First memory holes 35a are formed to pierce through the first to fourth tabular inter-word-line insulating layers $31a'$ to $31d'$, the first to fourth tabular polysilicon conductive layers $32a'$ to $32d'$, and the first tabular separation insulating layer $33a'$. The first memory holes 35a are formed in positions aligned near both ends in the column direction Y of the back gate holes 24. In the first memory holes 35a, silicon nitride (SiN) is deposited to form second sacrificial layers 92a.

Silicon oxide ($SiO_2$) and polysilicon (p-Si) are alternately laminated on the first tabular separation insulating layer $33a'$ to form fifth to eighth tabular inter-word-line insulating layers $31e'$ to $31h'$, fifth to eighth tabular polysilicon conductive layers $32e'$ to $32h'$, and a second tabular separation insulating layer $33b'$. The fifth to eighth tabular inter-word-line insulating layers $31e'$ to $31h'$, the fifth to eighth tabular polysilicon conductive layers $32e'$ to $32h'$, and the second tabular separation insulating layer $33b'$ are formed to two-dimensionally spread in the directions (the row direction X and the column direction Y) orthogonal to the laminating direction Z.

Second memory holes 35b are formed to pierce through the second tabular separation insulating layer $33b'$, the fifth to eighth tabular inter-word-line insulating layers $31e'$ to $31h'$, the fifth to eighth tabular polysilicon layers $32e'$ to $32h'$, and the first tabular separation insulating layer $33a'$ and drill a fourth tabular word-line polysilicon layer $32d'$. The second memory hole 35b is formed in a position aligned with the first memory hole 35a. In the second memory hole 35b, silicon nitride (SiN) is deposited to form third sacrificial layers 92b.

Figure 10A:
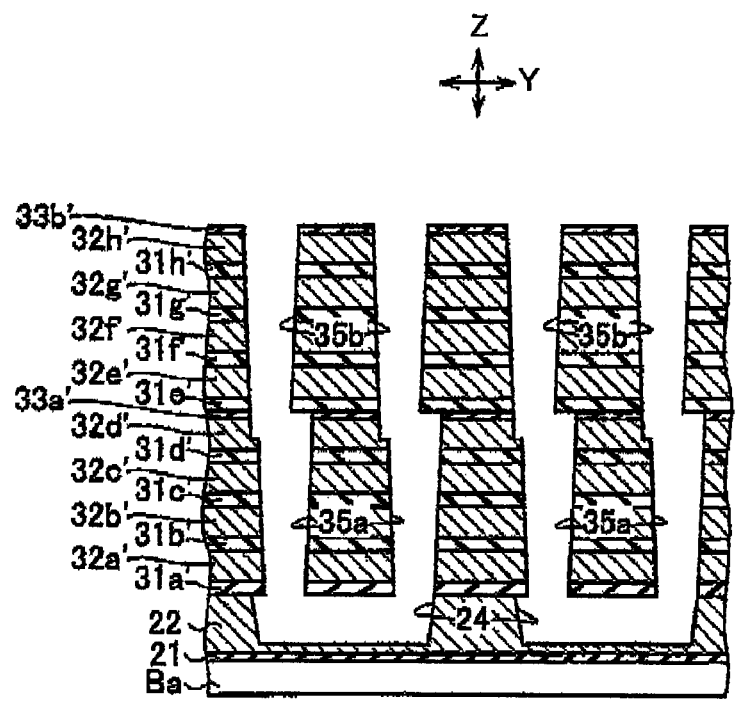
Figure 10B:
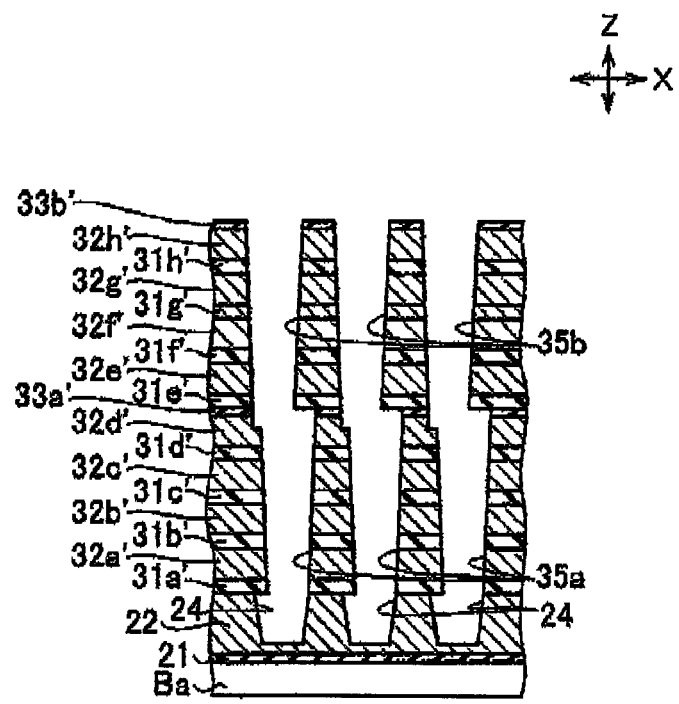

As shown in FIGS. 10A and 10B, the first sacrificial layers 91, the second sacrificial layers 92a, and the third sacrificial layers 92b are removed. For example, the removal of the first sacrificial layers 91, the second sacrificial layers 92a, and the third sacrificial layers 92b are performed in a hot phosphoric acid solution. Through such a process shown in FIGS. 10A and 10B, the first memory holes 35a, the second memory holes 35b, and the back gate holes 24 are formed again. The first memory holes 35a, the second memory holes 35b, and the back gate holes 24 communicate with one another and are formed in a U shape viewed from the row direction X. The first memory holes 35a, the second memory holes 35b, and the back gate holes 24 correspond to the U-tubes 6 shown in FIG. 1 and the like. For example, after the first memory holes 35a, the second memory holes 35b, and the back gate holes 24 are formed, the plastic film 4 is formed on the second tabular separation insulating layer $33b'$ to perform a conduction inspection for the U-tubes 6.

An exposed surface of the back gate conductive layer 22 and exposed surfaces of the first to eighth tabular polysilicon layers 32a to 32h are cleaned by diluted fluoric acid treatment to remove natural oxide films. After the natural oxide films in the U-tubes 6 are removed by the diluted fluoric acid treatment, the plastic film 4 can be formed on the second tabular separation insulating layer $33b'$ to perform the conduction inspection for the U-tubes 6.

Figure 11A:
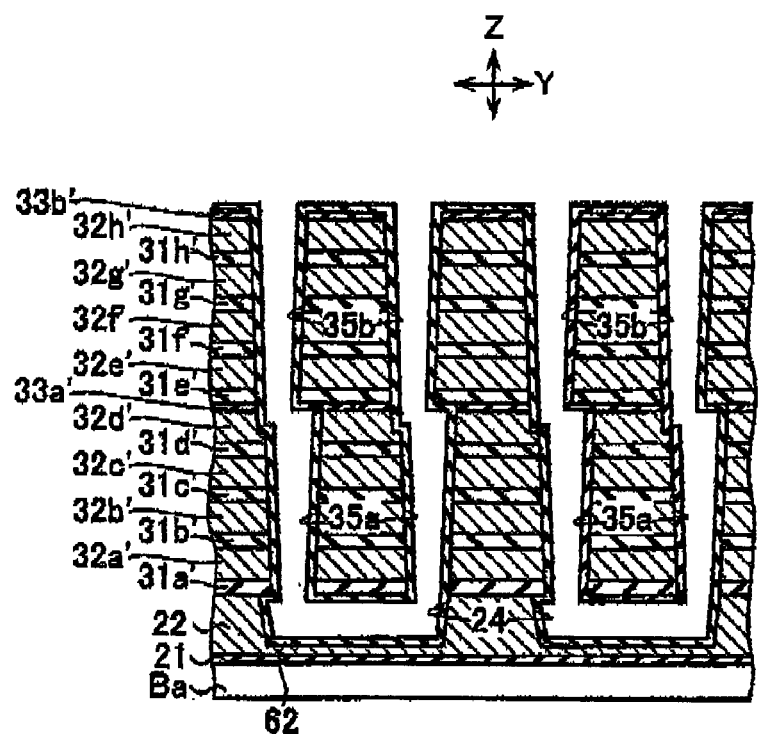
Figure 11B:
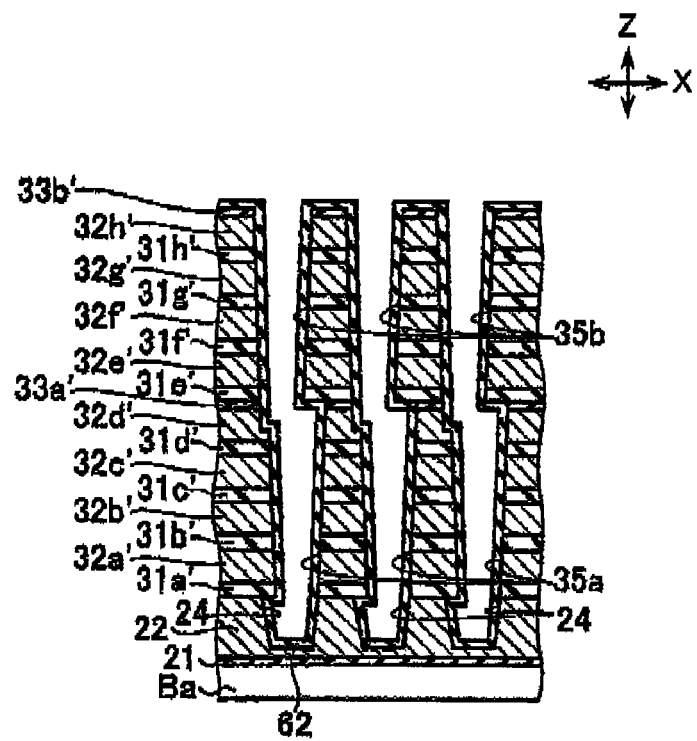

As shown in FIGS. 11A and 11B, a memory-gate insulating layer 62 is formed to cover sidewalls facing the back gate holes 24, the first memory holes 35a, and the second memory holes 35b and the second tabular separation insulating layer $33b'$. Specifically, silicon oxide (SiO2), silicon nitride (SiN), and silicon oxide (SiO2) are deposited to form the memory gate insulating layer 62. After the memory gate insulating layer 62 is formed, the plastic film 4 can be formed on the upper surface of the memory gate insulating layer 62 to perform the conduction inspection for the U-tubes 6.

Figure 12A:
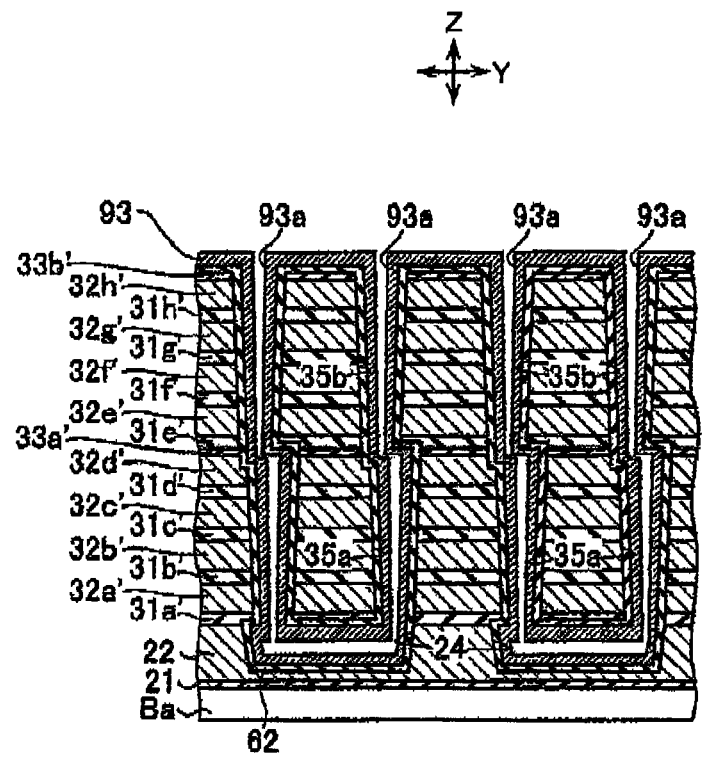
Figure 12B:
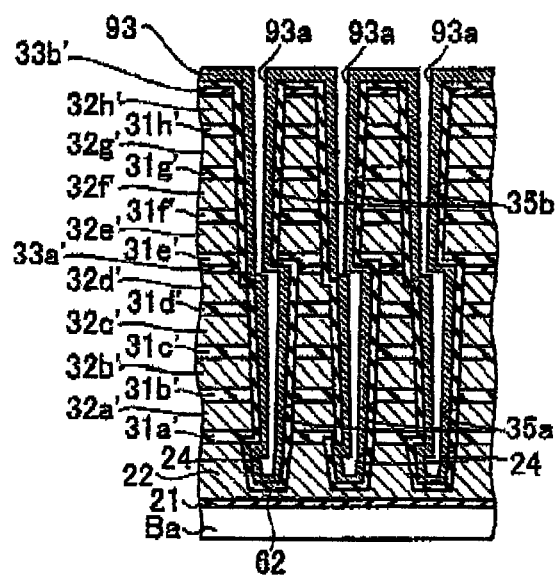

As shown in FIGS. 12A and 12B, amorphous silicon (a-Si) is deposited on the memory-gate insulating layer 62 to form an amorphous silicon layer 93. The amorphous silicon layer 93 is formed to have hollows 93a. In other words, the amorphous silicon layer 93 is formed not to completely fill the inside of the back gate holes 24, the first memory holes 35a, and the second memory holes 35b. After the amorphous silicon layer 93 is formed, the plastic film 4 can be formed on the upper surface of the amorphous silicon layer 93 to perform the conduction inspection for the U-tubes 6.

Figure 13A:
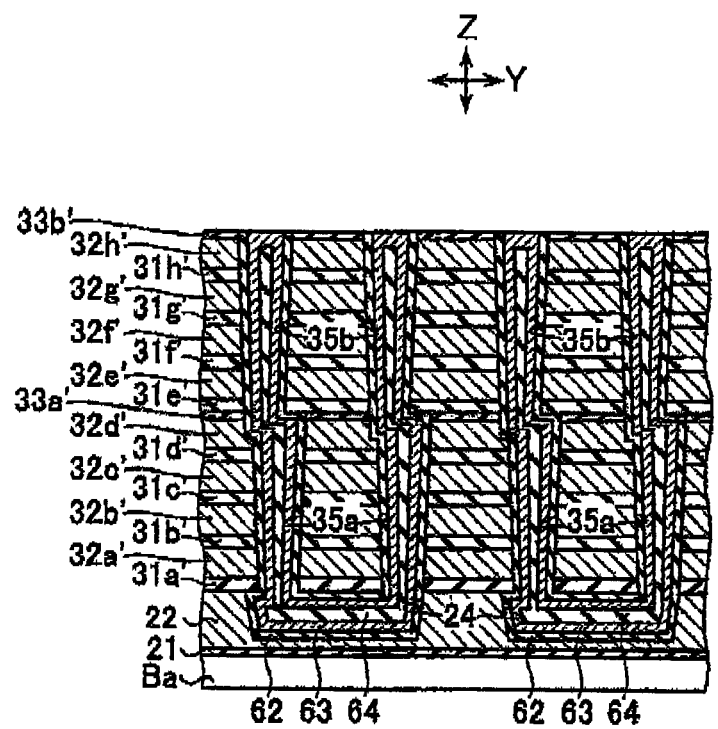
Figure 13B:
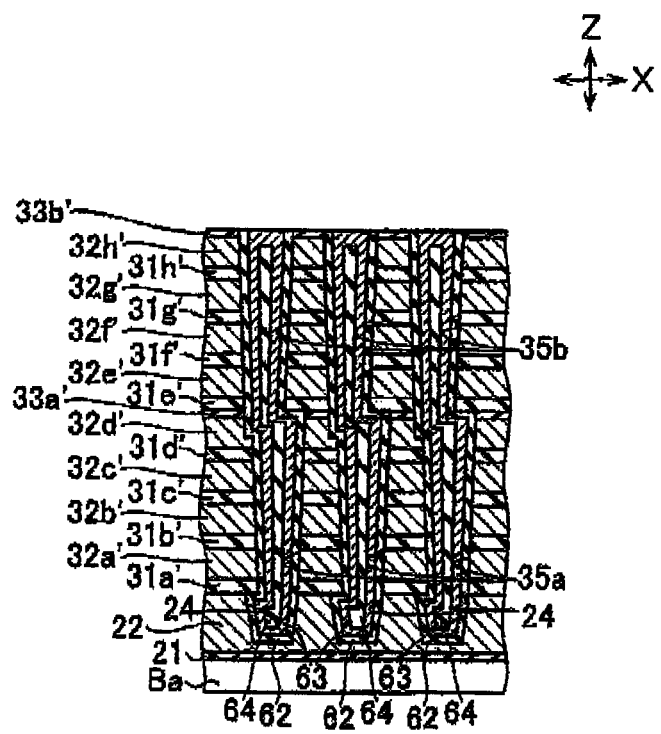

Sidewalls of the amorphous silicon layer 93 facing the hollows 93a are thermally oxidized to form silicon oxide ($SiO_2$). The remaining amorphous silicon layer 93 is crystallized to form polysilicon (p-Si). As shown in FIGS. 13A and 13B, a U-shaped semiconductor layer 63 is formed. On the silicon oxide ($SiO_2$) formed in the hollows 93a of the U-shaped semiconductor layer 63, silicon oxide ($SiO_2$) is further deposited by the chemical vapor deposition (CVD) to form an inner insulating layer 64 to fill the inside of the hollows 93a. The memory-gate insulating layer 62, the U-shaped semiconductor layer 63, and the internal insulating layer 64 deposited on the second tabular separation insulating layer $33b'$ are removed by the CMP treatment.

Figure 14A:
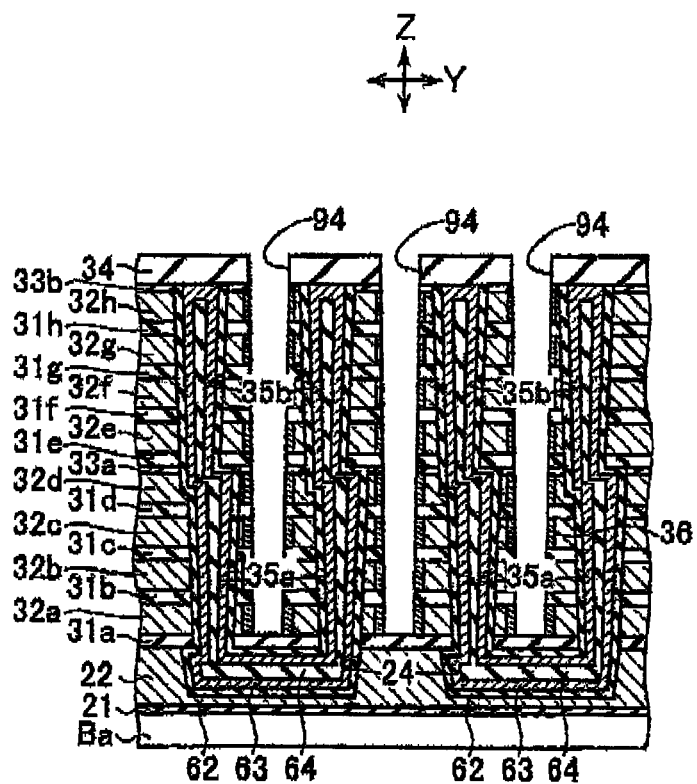
Figure 14B:
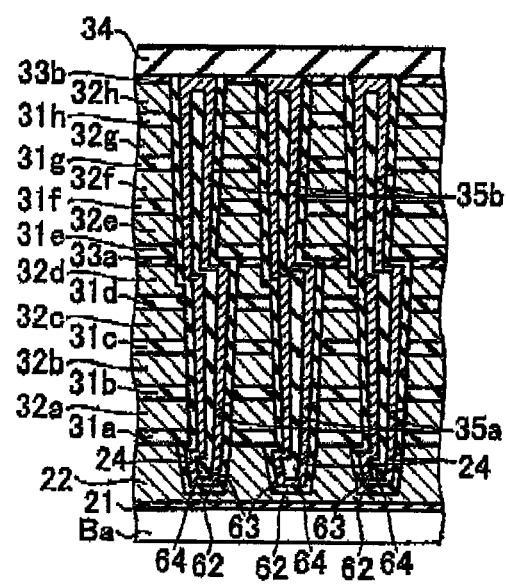

Thereafter, as shown in FIGS. 14A and 14B, silicon nitride (SiN) is deposited to cover the second tabular separation insulating layer $33b'$ to form a memory-protection insulating layer 34. Memory separation grooves 94 are repeatedly formed in a line shape to extend in the row direction X a predetermined space apart in the column direction Y. The memory separation grooves 94 are formed to be located among the first memory holes 35a and the second memory holes 35b in the column direction Y. The memory separation grooves 94 are formed to pierce through the memory-protection insulating layer 34, the first to eighth tabular inter-word-line insulating layers $31a'$ to $31h'$, the first to eighth tabular polysilicon layers $32a'$ to $32h'$, and the first and second separation insulating layers $33a'$ and $33b'$.

According to the process for forming the memory separation grooves 94, the first to eighth tabular inter-word-line insulating layers $31a'$ to $31h'$ change to first to eighth interword-line insulating layers 31a to 31h having a shape extending in parallel to the row direction X and repeatedly formed in a line shape a first space apart in the column direction Y. The first to eighth tabular polysilicon layers 32a' to 32h' change to first to eighth word-line conductive layers 32a to 32h having a shape extending in parallel to the row direction X and repeatedly formed in a line shape the first space apart in the column direction. The first and second tabular separation insulating layers 33a' and 33b' change to first and second separation insulating layers 33a and 33b having a shape extending in parallel to the row direction X and repeatedly formed in a line shape the first space apart in the column direction Y.

A cobalt (Co) film is deposited on the sides of the memory separation grooves 94 by the CVD. Thereafter, when rapid thermal annealing (RTA) treatment is further applied to the cobalt film, the cobalt film reacts with polysilicon (p-Si) forming the first to eighth word-line conductive layers 32a to 32h in a self-aligning manner to form a silicide film 36 on the surfaces of the first to eighth word-line conductive layers 32a to 32h. The cobalt film not reacting with polysilicon is removed in a sulfuric acid/hydrogen peroxide water mixture. The memory separation grooves 94 are filled with silicon nitride (SiN). The memory-protection insulating layer 34 is formed to extend to the inside of the memory separation grooves 94.

A layer between the semiconductor substrate Ba and the first tabular inter-word-line insulating layer 31a' is a back gate transistor layer 20 explained later. A layer from the first tabular inter-word-line insulating layer 31a' to the memory-protection insulating layer 34 is a memory transistor layer 30 explained later.

Figure 15A:
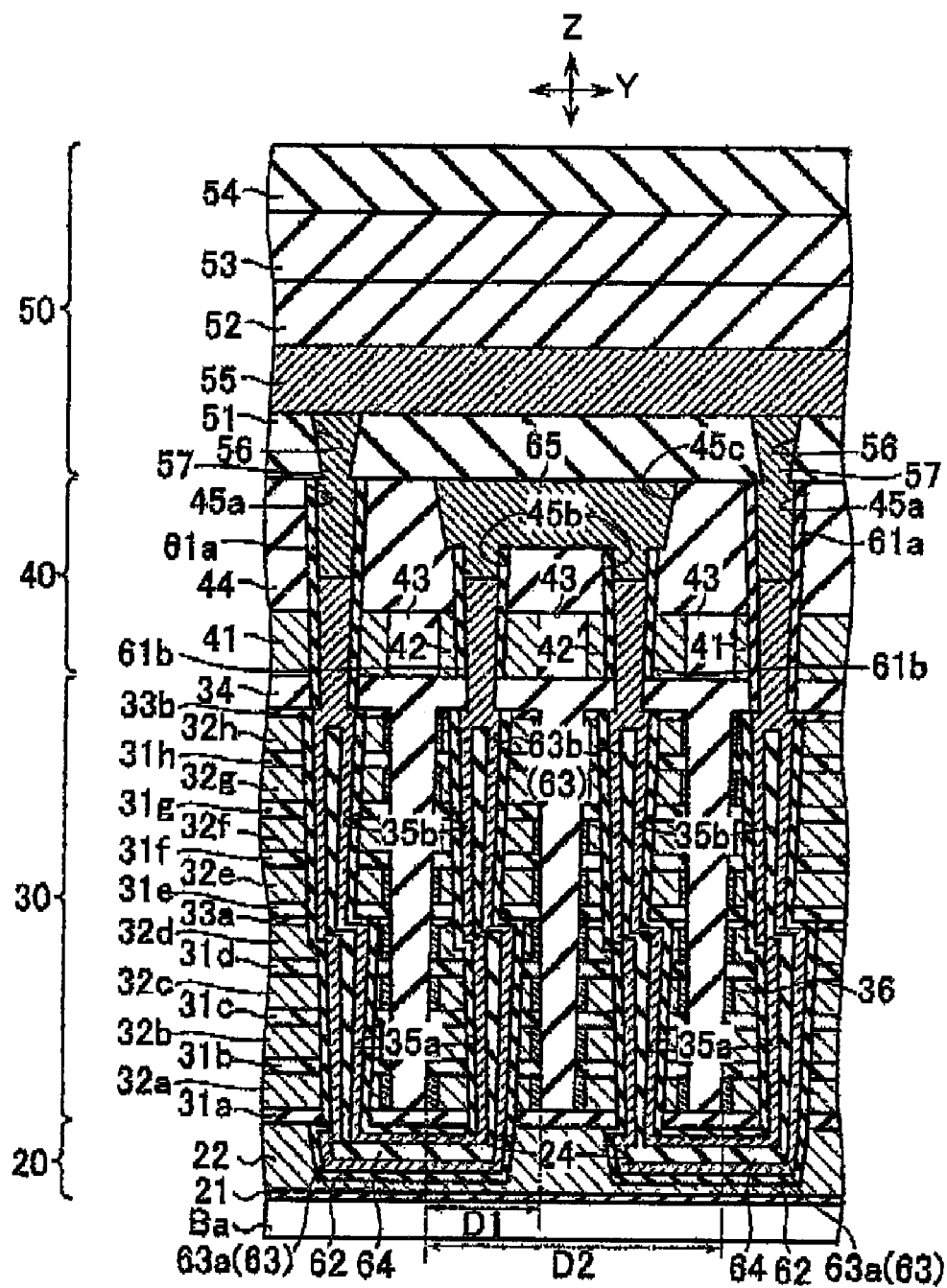
Figure 15B:
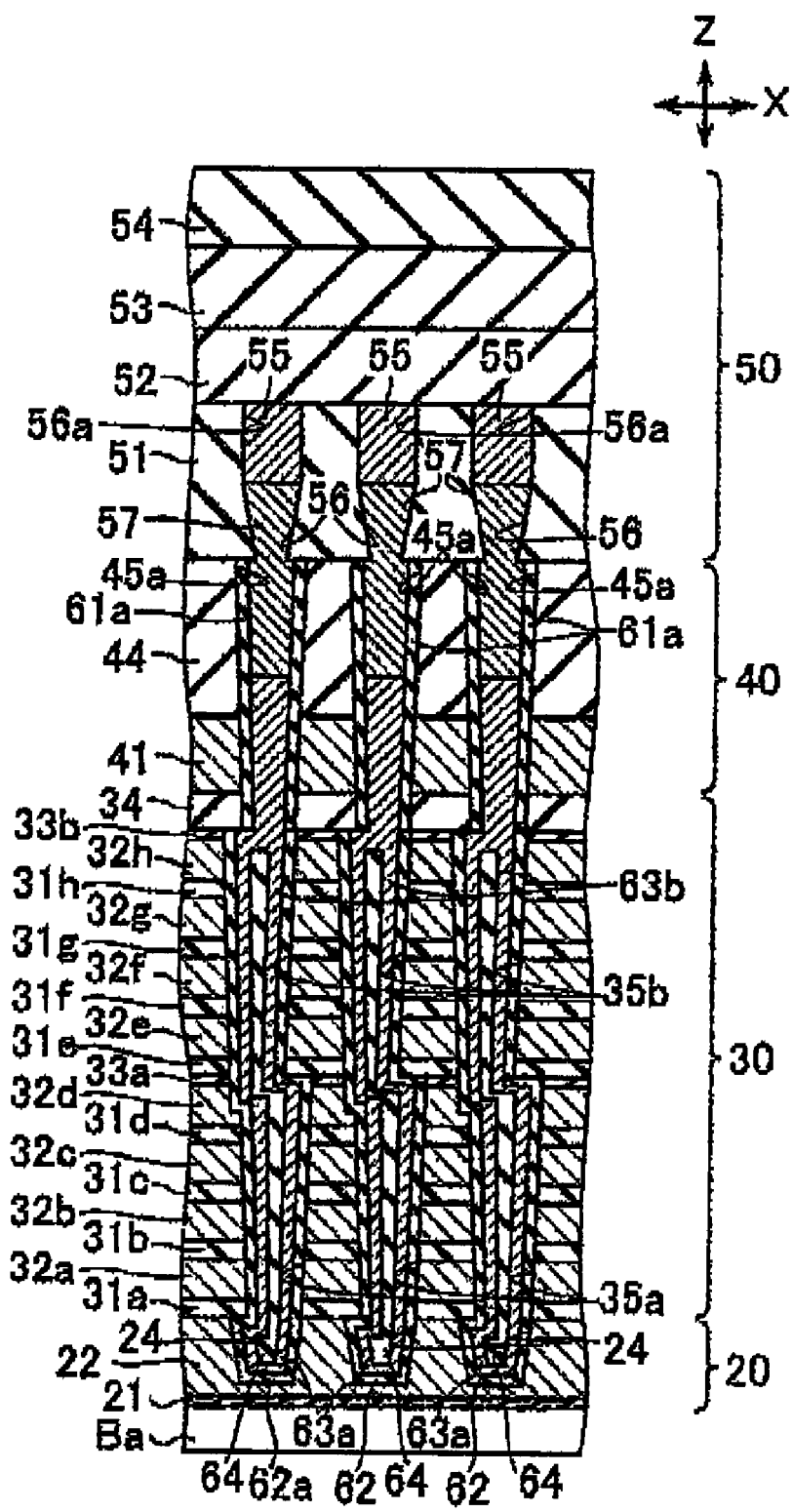

Thereafter, as shown in FIGS. 15A and 15B, a selection transistor layer 40 and a wiring layer 50 are formed on the upper layer side of the memory transistor layer 30. Consequently, the memory transistor region 12 (the memory string MS) has the back gate transistor layer 20, the memory transistor layer 30, the selection transistor layer 40, and the wiring layer 50 in order in the laminating direction Z from the semiconductor substrate Ba.

The back gate transistor layer 20 functions as a back gate transistor $BGTr_{mn}$ explained above. The memory transistor layer 30 functions as the memory transistor $MTr_{mn}$ explained above. The memory transistor layer 30 functions as the source-side selection transistor layer $SSTr_{mn}$ and the drain-side selection transistor $SDTr_{mn}$.

The selection transistor layer 40 has drain-side conductive layers 41, source-side conductive layers 42, interlayer insulating layers 43, and a selection-transistor insulating layer 44 deposited on the memory-protection insulating layer 34. The selection transistor layer 40 has drain side holes 45a formed to pierce through the selection-transistor insulating layer 44 and the drain-side conductive layers 41. The selection transistor layer 40 has source side holes 45b formed to pierce through the selection-transistor insulating layer 44 and the source-side conducive layer 42. A source-line wiring groove 45 is formed on the source side holes 45b adjacent to each other in the column direction Y to drill the selection-transistor insulating layer 44.

In the configuration explained above, drain-side gate insulating layers 61a are formed on sidewalls facing the drain side holes 45a. Source-side gate insulating layers 61b are formed on sidewalls facing the source side holes 45b. A source-line conductive layer 65 is formed to fill the inside of the source-line wiring grooves 45c from first height of the source-side holes 45b. The source-line conductive layer 65 is formed in a tabular shape parallel to the semiconductor substrate Ba.

The wiring layer 50 has a first wiring insulating layer 51, a second wiring insulating layer 52, a third wiring insulating layer 53, and a fourth wiring insulating layer 54 laminated in order on the selection-transistor insulating layer 44. The wiring layer 50 has bit-line wiring grooves 56a formed to drill the first wiring insulating layer 51 and bit-line plug holes 56 formed to pierce through the first wiring insulating layer 51 from below the bit-line wiring groove 56a.

Bit-line conductive layers 55 are formed in the bit-line wiring grooves 56a. Bit-line plug layers 57 are formed from the upper surfaces of U-shaped semiconductor layers 63 in the drain-side holes 45a to openings of the bit-line plug holes 56.

In this embodiment, the silicon wafer 1 covered with the plastic film 4 is exposed under the vacuum environment. However, the silicon wafer 1 covered with the plastic film 4 can be exposed under a pressurized environment. In this case, as in this embodiment, the plastic film 4 is deformed by a difference between the pressure in the inside of the U-tubes 6 and the pressure on the outside of the U-tubes 6 as long as the dregs 3 adhere to the hole bottom of the U-tube 6.

In the explanation of this embodiment, the plastic film 4 is swelled by the pressure difference in the defect inspection. However, the opening film that covers the openings can be destroyed by the pressure difference. When the opening film keeps the deformed state only under a negative pressure environment (e.g., in a vacuum) and a pressurized environment (pressure equal to or higher than the atmospheric pressure) and returns to the original shape under the atmospheric pressure environment, it can be inspected under the negative pressure environment or the pressurized environment whether the opening film is deformed.

In the explanation of this embodiment, the plastic film 4 is formed under the atmospheric pressure environment and exposed under the negative pressure environment to be deformed. However, the plastic film 4 can be formed under the negative pressure environment and the pressurized environment. When the plastic film 4 is formed under the negative pressure environment, the plastic film 4 can be deformed by being exposed under the pressurized environment or in the atmospheric pressure. When the plastic film 4 is formed under the pressurized environment, the plastic film 4 can be deformed by being exposed under the negative pressure environment or in the atmospheric pressure. It is possible to deform the plastic film 4 by exposing, as explained above, the silicon wafer 1 covered with the plastic film 4 under the pressurized environment (a second air pressure state) different from the pressurized environment (a first air pressure state) under which the plastic film 4 is formed.

A thermoplastic film can be used as the opening film, In this case, the silicon wafer 1 is exposed under the negative pressure environment in a state in which heat is applied to the opening film. Consequently, the opening film is deformed if the dregs 3 adhere to the hole bottom of the U-tube 6.

A thermosetting film can be used as the opening film. In this case, heat is applied to the opening film in a state in which the silicon wafer 1 is exposed under the negative pressure environment. Consequently, the plastic film 4 hardens in a deformed state if the dregs 3 adhere to the hole bottom of the U-tube 6.

As explained above, according to this embodiment, the plastic film 4 on the U-tube 6 in which the dregs 3 are left at the hole bottom thereof is deformed by exposing the silicon wafer 1 covered with the plastic film 4 in the vacuum state. Therefore, a conduction state of the U-tube 6 (the tubular contact hole) can be easily inspected.

In the defect inspecting apparatus in the past that detects secondary electrons, an inspection target has to be conductive to the earth. However, in this embodiment, deformation of the plastic film 4 (the plug material) is detected. This makes it possible to inspect the entire surface of the silicon wafer 1 irrespectively of presence or absence of earth conduction of an inspection target.

In the optical defect inspection for detecting pattern abnormality, only observation of actual holes can be performed from the surface. However, in this embodiment it is possible to indirectly detect defects in contact holes in which actual holes cannot be observed from the surface. This makes it possible to inspect the entire surface of the silicon wafer 1 even when contact holes have a large aspect ratio.

The plastic film 4 is formed in the opening of the U-tube 6. This makes it possible to easily determine presence or absence of deformation of the plastic film 4. Further, the plastic film 4 is formed on the wiring layer 10 not to enter the opening hole of the U-tube 6. This makes it possible to deform the plastic film 4 with a small air pressure difference and makes it easy to remove the plastic film 4 after a defect inspection.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A defect inspecting method comprising:
   forming, in a first air pressure state, a film, which covers one opening of two openings provided on an upper surface of a substrate, on a tubular contact hole formed on the substrate in manufacturing a semiconductor device and formed in a tubular shape by connecting two cylindrical contact holes on bottom surface sides thereof, both ends of the tubular shape being opened in the openings;
   deforming the film on the tubular contact hole, a part of the tubular shape of which is blocked in the tubular contact hole, by exposing the substrate covered with the film in a second air pressure state different from the first air pressure state; and
   observing whether the film is deformed to thereby inspect whether the part of the tubular shape of the tubular contact hole is blocked.

2. The defect inspecting method according to claim 1, wherein the film has plasticity.

3. The defect inspecting method according to claim 1, wherein
   the film has thermoplasticity, and
   the substrate covered with the film is exposed in the second air pressure state in a state in which heat is applied to the substrate.

4. The defect inspecting method according to claim 1, wherein
   the film has thermosetting and
   heat is applied to the film in a state in which the substrate covered with the film is exposed in the second air pressure state.

5. The defect inspecting method according to claim 1, wherein the film is formed to cover an upper surface side of the openings without being embedded in the tubular shape of the tubular contact hole.

6. The defect inspecting method according to claim 1, wherein the film is formed by bonding of a film, application of a film to be formed, application of a film in a predetermined position by a dispensing device, or screen printing of a film in the predetermined position by a screen printing device.

7. The defect inspecting method according to claim 1, wherein
   the film or the film to be formed has photosensitivity, and
   the film that covers the one opening is patterned by exposing only a predetermined section of the film or the film to be formed to light.

8. The defect inspecting method according to claim 1, wherein
   the film to be formed is a resist, and
   the film that covers the one opening of the openings is patterned by exposing a part of the resist to light.

9. The defect inspecting method according to claim 1, wherein the film is expanded or destroyed by being exposed in the second air pressure state.

10. The defect inspecting method according to claim 1, wherein the inspection concerning whether a part of the tubular shape of the tubular contact hole is blocked is performed by observing the film in the second air pressure state.

11. The defect inspecting method according to claim 1, wherein a plurality of the one openings of the openings are collectively covered with the film.

12. The defect inspecting method according to claim 1, wherein the openings are arranged in a matrix shape at predetermined intervals in a vertical direction and a horizontal direction when the substrate is viewed from an upper surface side.

13. The defect inspecting method according to claim 1, wherein the first air pressure state is an atmospheric pressure and the second air pressure state is a state under a negative pressure environment.

14. The defect inspecting method according to claim 1, wherein the first air pressure state is an atmospheric pressure and the second air pressure state is a state under a pressurized environment.

15. The defect inspecting method according to claim 1, wherein the first air pressure state is a state under a negative pressure environment and the second air pressure state is a state under a pressurized environment.

16. The defect inspecting method according to claim 1, wherein the first air pressure state is a state under a negative pressure environment and the second air pressure state is an atmospheric pressure.

17. The defect inspecting method according to claim 1, wherein the first air pressure state is a state under a pressurized environment and the second air pressure state is an atmospheric pressure.

18. The defect inspecting method according to claim 1, wherein the first air pressure state is a state under a pressurized environment and the second air pressure state is a state under a negative pressure environment.

* * * * *